United States Patent [19]
Yamazaki et al.

[11] Patent Number: 5,058,798
[45] Date of Patent: Oct. 22, 1991

[54] METHOD FOR FORMING BUMP ON SEMICONDUCTOR ELEMENTS

[75] Inventors: Nobuto Yamazaki, Tachikawa; Akihiro Nishimura, Hachioji, both of Japan

[73] Assignee: Kabushiki Kaisha Shinkawa, Tokyo, Japan

[21] Appl. No.: 510,152

[22] Filed: Apr. 16, 1990

[30] Foreign Application Priority Data

Apr. 17, 1989 [JP] Japan ............................. 1-96947

[51] Int. Cl.$^5$ ............................. H01L 21/607
[52] U.S. Cl. ............................. 228/110; 228/179; 228/904
[58] Field of Search ............... 228/110, 179, 1.1, 4.5, 228/904

[56] References Cited

U.S. PATENT DOCUMENTS

| | | | |
|---|---|---|---|
| 3,531,852 | 10/1970 | Slemmons et al. | 228/110 |
| 3,689,983 | 9/1972 | Eltzroth et al. | 228/4.5 |
| 3,734,386 | 5/1973 | Hazel | 228/1.1 |
| 4,750,666 | 6/1988 | Neugebauer et al. | 228/4.5 |
| 4,771,930 | 9/1988 | Gillotti et al. | 228/1.1 |

FOREIGN PATENT DOCUMENTS

| | | | |
|---|---|---|---|
| 25822 | 7/1974 | Japan | 228/1.1 |
| 150854 | 7/1987 | Japan | 228/110 |
| 1177528 | 1/1970 | United Kingdom | 228/1.1 |

OTHER PUBLICATIONS

IBM Technical Disclosure Bulletin, "Wire Bumping of Metal Surface", vol. 30, No. 7, p. 212, Dec. 1987.

*Primary Examiner*—Samuel M. Heinrich
*Attorney, Agent, or Firm*—Koda and Androlia

[57] ABSTRACT

Method of forming bumps out of wire on the electrode of a semiconductor element is executed by setting a tip end underneath a vertically movable wedge, lowering the wedge to press the tip end of the wire against the semiconductor element, securely connecting the tip end to the electrode, and then pulling the wire away from the electrode to cut the wire, leaving the tip end on the electrode.

2 Claims, 3 Drawing Sheets

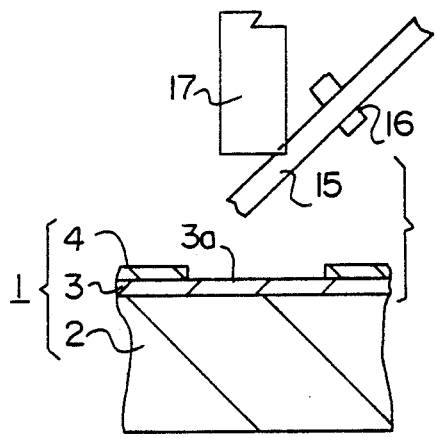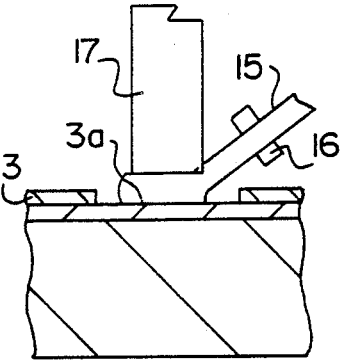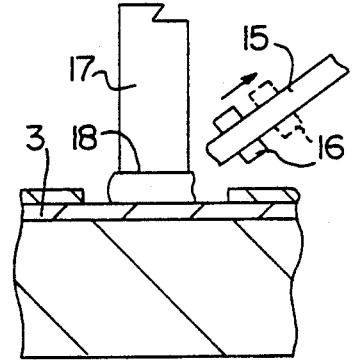
FIG. 1a     FIG. 1b     FIG. 1c
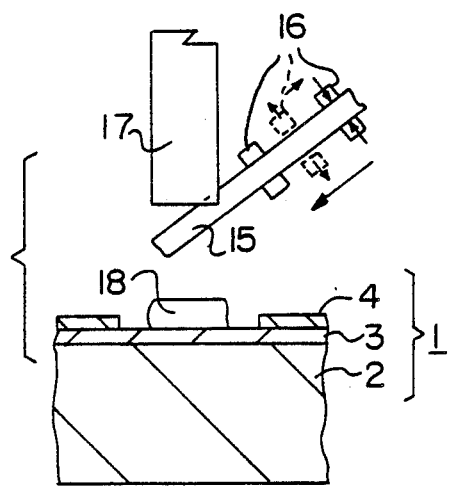
FIG. 1d

METHOD FOR FORMING BUMP ON SEMICONDUCTOR ELEMENTS

BACKGROUND OF THE INVENTION

1. Field of the Invention

The present invention relates to a method for forming a bump on electrodes of a semiconductor element.

2. Prior Art.

There are two different ways in forming a bump on semiconductor elements: one is a plating method as shown in FIG. 3 and the other is a ball bonding method shown in FIG. 4.

In these methods, a semiconductor element 1 is formed with an Si layer 2 and an electrode 3 such as an Al wire formed on the Si layer 2. A protective layer 4 is formed on the electrode 3 except for the part on which the bump is formed.

In the plating method shown in FIG. 3, a barrier layer 5 is formed around the bump forming area on the electrode 3, and the bump 6 is formed on the barrier 5 by plating. The bump 6 is formed by the following process: a metal barrier is vapor deposited around the bump forming area on the semiconductor element 1, a resist is applied (as preparation for plating), plating is performed, the resist is removed, another resist is applied (for the metal barrier to be removed), the metal barrier is removed, and then the resist is removed.

One example of the ball bonding method such as the one shown in FIG. 4 is described in Japanese Patent Application Laid-Open No. 54-2662.

More specifically, as shown in FIG. 4(a), a ball is first formed on a wire 8, which passes through the capillary 7, by discharging etc. Next, as shown in FIG. 4(b), the capillary 7 is lowered so that the ball 9 is pressed down against the electrode 3 by the capillary, and then the capillary 7 is raised as shown in FIG. 4(c). In the next step, the wire 8 is clamped by a clamper (not shown) as shown in FIG. 4(d), and the clamper and capillary are raised to cut the ball 9 out of the wire, thus forming ball-shaped bump 10 on the electrode 3.

The methods above involves some problems.

According to the method shown in FIG. 3, since a considerable number of steps and expensive equipment are needed, the costs to form the bump tends to be high. In addition, the quality of the semiconductor element gradually drops as the steps progress, resulting in a poor yield.

In the ball-forming method of FIG. 4, it is necessary to form the ball 9, and the ball 9 is two or three times as large as that of the wire 8 in diameter. As a result, a narrow (bump forming) pitch is not obtainable. Also, the height of the bump 10 tends to vary depending upon the shape of the flattened ball 9 and upon how the wire 8 is cut, and this can affect the inner lead bonding which will be performed in the postprocessing.

Furthermore, the ball-bonding method usually requires the semiconductor element be heated at about 250° C. so as to connect the ball to the electrode for the purpose of increasing the bondability. Thus, since the semiconductor element is heated for a long time, the color of the bump 10 changes and purple plating corrosion can result in the joint area of the bump and the electrode. In addition, a primary eutectic is made from Au and Al, which are the material for the wire and the electrode, respectively, and this has an adverse influence on the lead bonding in the postprocessing.

SUMMARY OF THE INVENTION

Accordingly, the object of the present invention is to provide a bump formation method that can cut the manufacturing costs, can give a narrower bump forming pitch, and can provide even bump height.

The object of the present invention is accomplished by a unique method wherein a wire, located at the bottom of a wedge, is pressed by the wedge against the electrode, and then the wire is cut while the wire is being pressed by the wedge, thus forming a bump out of the wire on the electrode.

The object can also be achieved by pressing a wire against the electrode with the wedge, and then cutting the wire after the wedge has been moved up, thus forming the bump on the electrode.

Because the wire is pressed and connected to the electrode by the wedge, the wire is not pressed to any considerable degree, and the wire is not flattened. In other words, the amount of wire which is consumed to become the bump is small, and the bump is not flattened to spread widely. Accordingly, the bump is formed at narrow pitch and at uniform height.

BRIEF DESCRIPTION OF THE DRAWINGS

FIGS. 1(a) through 1(d) show steps of a first embodiment of the present invention;

DETAILED DESCRIPTION OF THE INVENTION

Figure 2A:
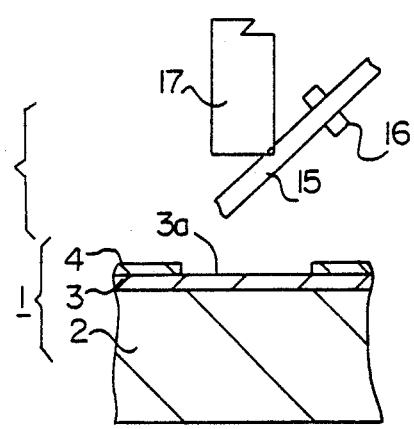
FIGS. 2(a) through 2(e) show steps of a second embodiment of the present invention.
Figure 2B:
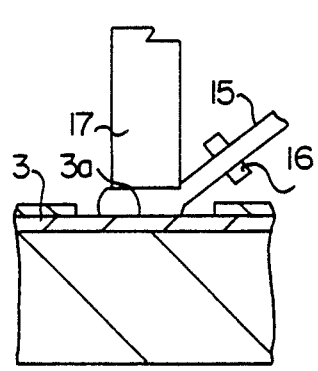
Figure 2C:
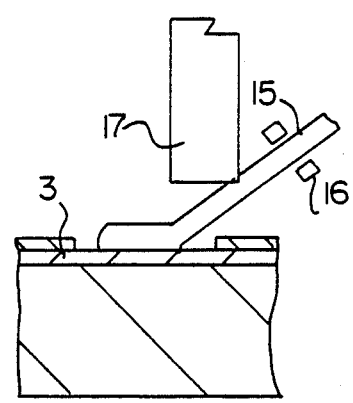

As shown in FIG. 1(a), a predetermined amount of wire is fed to the bottom of a wedge 17 by passing the tip of the wire 15 through a wire guide (not shown) and a clamper 16. The wire 15 is stored on a spool (not shown).

The wedge 17 is lowered to the bump-forming area 3a, and the wire 15 is pressed against the electrode 3 as shown in FIG. 1(b). At the same time, ultrasonic vibrations are applied to the horn (not shown) on which the wedge 17 is mounted. Thus, the wire 15 is connected to the electrode 3.

Next, as shown in FIG. 1(c), the clamp 16, while it is closed, is moved upwards diagonally as indicated by the arrow. Thus, the wire 15 is pulled, and the tip end of the wire 15 is cut by the wedge 17, leaving only the flattened part (tip end) of the wire on the electrode 3. The bump 18 is thus formed.

After this, as seen in FIG. 1(d), the wedge 17 is raised. The clamper 16 is opened, moved up, closed to hold the wire and then moved down, so that a predetermined amount of the tip end of the wire 15 is placed underneath the wedge 17. The wedge 17, the wire 15, and the clamper 16 are kept at their positions, so that they stay above the electrode 3 as seen in FIG. 1(a) to perform the next bump formation.

FIG. 2 shows another embodiment of the present invention. Steps in FIGS. 2(a) and 2(b) are the same as those of FIGS. 1(a) and 1(b). After the step of FIG. 2(b) wherein the wire 15 is pressed against the electrode 3, the wedge 17 is raised in the direction that the wire 15 extends (diagonally) while the clamper 16 is open as shown in FIG. 2(c). Then, as seen in FIG. 2(d), the clamper 16 is closed and moved up diagonally so that the wire 15 is pulled. Thus, the wire 15 is cut to leave the bump 18 on the electrode 3.

Figures 2D, 2E:
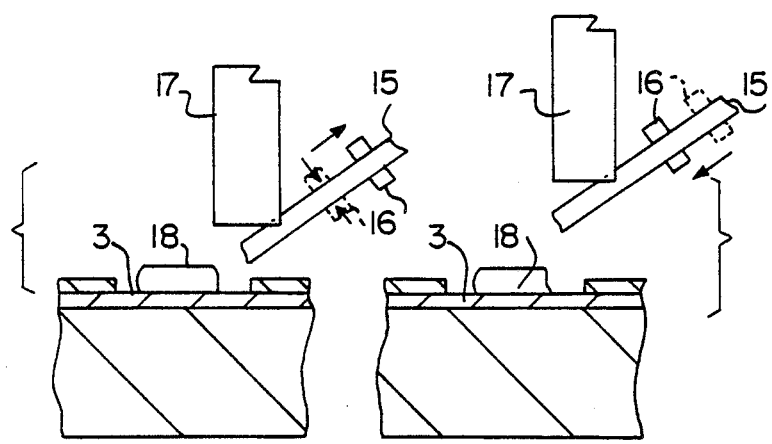
Figure 3:
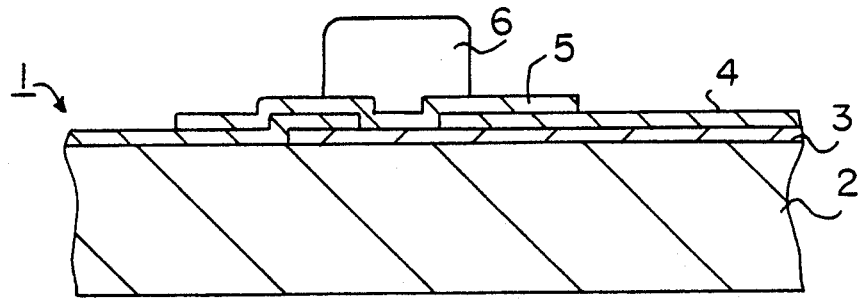
FIG. 3 shows prior art plating method.
Figure 4A:
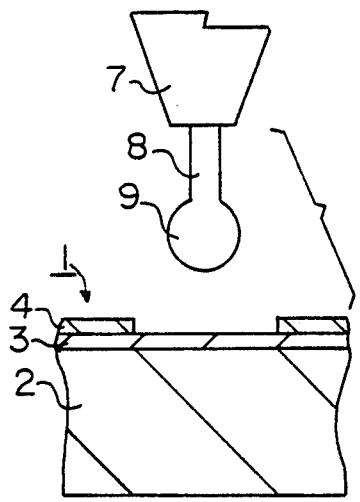
FIGS. 4(a) through 4(d) show steps of prior art ball bonding method.
Figure 4B:
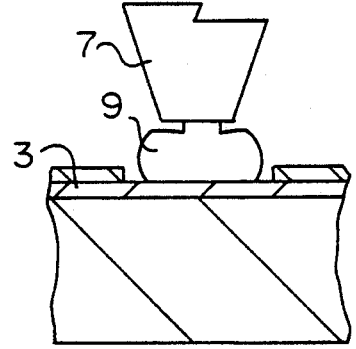
Figure 4C:
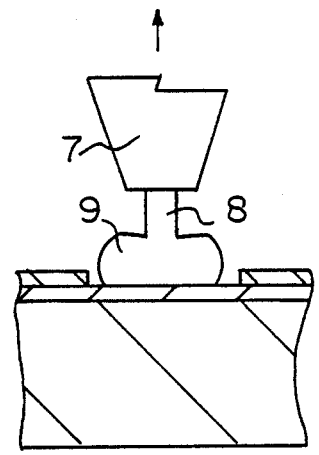
Figure 4D:
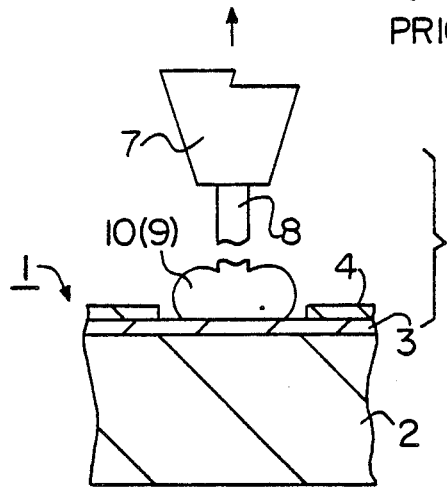

Next, as seen in FIG. 2(e), both the wedge 17 and the clamper 16 are moved up further together, and then only the clamper 16 is moved diagonally down. As a result, a predetermined amount of the tip end of the wire 15 is fed under the wedge 17 for next bump formation.

As seen from the above two embodiments, the wire 15 is pressed and connected to the electrode 3 by the wedge 17. Accordingly, the wire 15 is not pressed to any considerable degree and the wire is not flattened so widely. As a result, a narrow pitch (or bump forming pitch) is obtainable, and the height of the bump can be even.

In addition, since the wedge 17 is used, ultrasonic vibrations can be applied to the wedge 17 and the bump 18 can be formed at a low temperature. Thus, heating is not always required (in other words, heating can be a secondary requirement) for forming the bump 18, without giving any affects to the bump and the joint surface between the bump 18 and the electrode 3. As a result, the quality of the lead bonding obtained in a post processing can be improved.

The shape of the cross section of the wire 15 used in the present invention is not specifically restricted, and it may be round, rectangular, or square. However, if the cross section of the wire is rectangular or square, the height of the bump can be more even.

The direction of forming the bump 18 on the semiconductor element is not specifically restricted, and it can be optionally chosen. However, if the bump 18 is formed in the longitudinal direction of the bump forming area 3a, it is easier to form the bump 18.

As described above, since the wire is pressed and settled on the electrode by means of a wedge, the wire is not pressed to any considerable degree and the wire is not flattened so widely. In other words, the amount of the wire pressed and the amount of wire spread by such pressing can be minimum. Accordingly, a bump can be formed at a narrow pitch and the height of the bumps can be even.

We claim:

1. A method for forming a bump on an electrode of a semiconductor element comprising the steps of:
    setting a tip end of a wire, from which said bump is formed, under a vertically movable wedge;
    lowering said wedge to press said tip end of said wire against said electrode;
    applying ultrasonic vibrations to said wedge to connect said tip end to said electrode; and
    pulling said wire diagonally away from said electrode so as to cut said wire while said wedge presses said tip end against said electrode, leaving said tip end on said electrode to form said bump.

2. A method for forming a bump on an electrode of a semiconductor element comprising the steps of:
    setting a tip end of a wire, from which said bump is formed, under a vertically movable wedge;
    lowering said wedge to press said tip end against said electrode;
    applying ultrasonic vibrations to said wedge to connect said tip end to said electrode;
    pulling said wire diagonally with a clamper while said wedge presses said tip end against said electrode to cut said tip end out of said wire to form said bump; and
    raising said wedge from said bump.

* * * * *